United States Patent
Suzuki et al.

(10) Patent No.: US 11,163,233 B2
(45) Date of Patent: Nov. 2, 2021

(54) CHEMICALLY AMPLIFIED POSITIVE TYPE PHOTORESIST COMPOSITION AND PATTERN FORMING METHOD USING THE SAME

(71) Applicant: Merck Patent GmbH, Darmstadt (DE)

(72) Inventors: Masato Suzuki, Kakegawa (JP); Shunji Kawato, Kakegawa (JP); Tetsumasa Takaichi, Kakegawa (JP); Kazumichi Akashi, Kakegawa (JP)

(73) Assignee: Merck Patent GmbH, Darmstadt (DE)

( * ) Notice: Subject to any disclaimer, the term of this patent is extended or adjusted under 35 U.S.C. 154(b) by 197 days.

(21) Appl. No.: 16/475,562

(22) PCT Filed: Jan. 2, 2018

(86) PCT No.: PCT/EP2018/050006
§ 371 (c)(1),
(2) Date: Jul. 2, 2019

(87) PCT Pub. No.: WO2018/127467
PCT Pub. Date: Jul. 12, 2018

(65) Prior Publication Data
US 2019/0339614 A1    Nov. 7, 2019

(30) Foreign Application Priority Data
Jan. 4, 2017    (JP) .............................. JP2017-000270

(51) Int. Cl.
*G03F 7/004* (2006.01)
*G03F 7/039* (2006.01)
*H01L 21/027* (2006.01)
*G03F 7/16* (2006.01)
*G03F 7/20* (2006.01)
*G03F 7/32* (2006.01)
*G03F 7/38* (2006.01)

(52) U.S. Cl.
CPC .......... *G03F 7/0045* (2013.01); *G03F 7/0046* (2013.01); *G03F 7/0392* (2013.01); *H01L 21/0274* (2013.01); *G03F 7/162* (2013.01); *G03F 7/168* (2013.01); *G03F 7/2004* (2013.01); *G03F 7/2006* (2013.01); *G03F 7/322* (2013.01); *G03F 7/38* (2013.01)

(58) Field of Classification Search
CPC .... G03F 7/0045; G03F 7/0392; G03F 7/0397; G03F 7/039; G03F 7/0395; G03F 7/0382; G03F 7/0387; G03F 7/038; G03F 7/0385
See application file for complete search history.

(56) References Cited

U.S. PATENT DOCUMENTS

| | | | |
|---|---|---|---|
| 2001/0038970 A1 | 11/2001 | Cameron et al. | |
| 2003/0235782 A1 | 12/2003 | Padmanaban et al. | |
| 2004/0229155 A1* | 11/2004 | Rahman | G03F 7/0045 430/270.1 |
| 2007/0111138 A1 | 5/2007 | Rahman et al. | |
| 2010/0143830 A1* | 6/2010 | Ohashi | G03F 7/0392 430/5 |
| 2014/0072905 A1 | 3/2014 | Tsuchimura et al. | |
| 2015/0118618 A1 | 4/2015 | Aqad et al. | |
| 2016/0342083 A1 | 11/2016 | Ueba et al. | |
| 2016/0363859 A1* | 12/2016 | Namai | G03F 7/325 |
| 2017/0038685 A1 | 2/2017 | Goto et al. | |

FOREIGN PATENT DOCUMENTS

| | | | |
|---|---|---|---|
| JP | 3677963 B2 | 8/2005 | |
| JP | 2006258925 A | 9/2006 | |
| KR | 20090026077 A | * | 3/2009 |

OTHER PUBLICATIONS

English Machine Translation of KR20090026077A (Year: 2009).*
International Search Report for PCT/EP2018/050006 dated Apr. 24, 2018.
Written Opinion of the International Searching Authority for PCT/EP2018/050006 dated Apr. 24, 2018.

* cited by examiner

*Primary Examiner* — John A McPherson
*Assistant Examiner* — Nicholas E Brown
(74) *Attorney, Agent, or Firm* — Faegre Drinker Biddle & Reath LLP

(57) ABSTRACT

[Problem] To provide a chemically amplified positive type photoresist composition capable of forming a pattern having an excellent cross-sectional shape, and a pattern forming method using the same. [Means for Solution] A chemically amplified positive type photoresist composition comprising (A) a polymer which reacts with an acid to increase its solubility in an alkaline aqueous solution, (B) an organic solvent, (C) a first photo acid generator containing a cation having no polar group, and (D) a second photoacid generator containing a cation having a polar group, and a pattern forming method using the same.

16 Claims, 1 Drawing Sheet

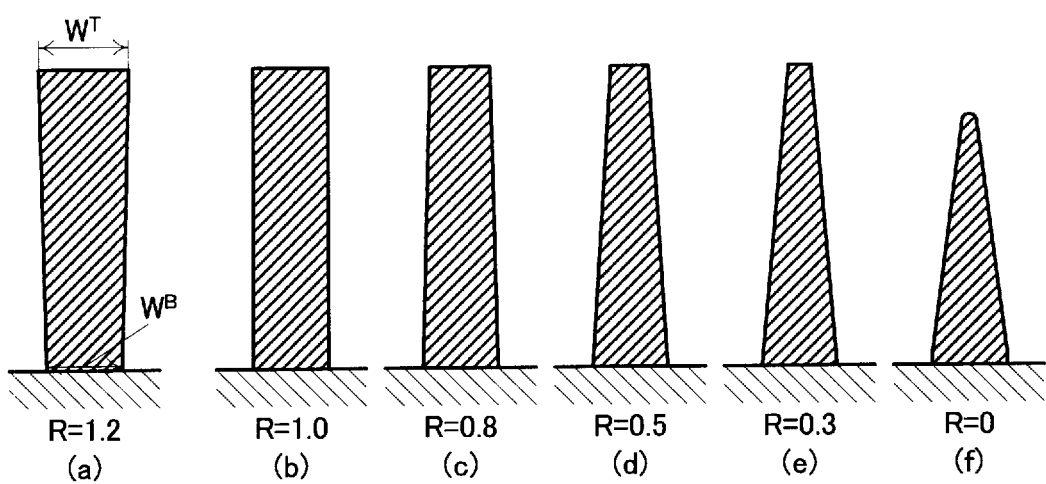

CHEMICALLY AMPLIFIED POSITIVE TYPE PHOTORESIST COMPOSITION AND PATTERN FORMING METHOD USING THE SAME

CROSS-REFERENCE TO RELATED APPLICATIONS

This application is a national stage application (under 35 U.S.C. § 371) of PCT/EP2018/050006, filed Jan. 2, 2018, which claims benefit of Japanese Application No. 2017-000270, filed Jan. 4, 2017, both of which are incorporated herein by reference in their entirety.

BACKGROUND OF THE INVENTION

Technical Field

The present invention relates to a chemically amplified positive type photoresist composition to be used for manufacturing semiconductor devices, semiconductor integrated circuits and the like, and a pattern forming method using the same.

Background Art

When attempting to form a fine pattern by lithography method, a high resolution is required for the resist material. To meet such a demand, a chemically amplified resist composition comprising a base resin and a photoacid generator (hereinafter sometimes referred to as PAG) is used.

For example, a chemically amplified positive type resist composition comprises a resin component, solubility of which in an alkali aqueous solution increases by the action of an acid, and a PAG which generates an acid when exposed to light. Upon forming a resist pattern, when the acid is generated by the PAG, the exposed portion becomes alkali-soluble.

Generally, a film obtained by lithography method can be classified into a so-called thin film resist of about 50 to 900 nm and a thick film resist of 1 μm or more. Between these, the thick film resist is used for manufacturing semiconductor devices, micromachines, implant masks and the like, and the resist composition used for that purpose is required to have a high resolution and high sensitivity, and the pattern to be manufactured is required to have accuracy. Further, combined with the miniaturization of semiconductor devices and the like, it is recently required to manufacture a pattern having a high aspect ratio with higher accuracy. However, when a resist pattern with a high aspect ratio was formed using a conventionally known resist composition, the cross section did not become a rectangular shape in many cases. Specifically, when observing the trench part formed by lithography method, the inner side surface of the trench part was not vertical, and the trench widths were sometimes different between the part in the vicinity of the surface and the part in the vicinity of the bottom surface of the trench part.

PRIOR ART DOCUMENTS

Patent Documents

[Patent Document 1] JP-B No. 3,677,963

SUMMARY OF THE INVENTION

Problems to be Solved by the Invention

If the cross section of a resist pattern is not a rectangular shape, the precision of a device to be manufactured using the resist pattern may be deteriorated. Further, the thicker the film thickness becomes, the more remarkable the problem becomes. Therefore, a composition capable of forming a pattern having a cross-sectional shape which is nearer to a rectangular shape even when the film thickness is thick has been desired.

Means for Solving the Problems

The chemically amplified positive type photoresist composition according to the present invention comprises:
(A) a polymer which reacts with an acid to increase its solubility in an alkaline aqueous solution,
(B) an organic solvent,
(C) a first photoacid generator selected from the group consisting of XA-ZA, XB-ZA, XB-ZB, XB-ZC and XC-ZA, and
(D) a second photoacid generator selected from the group consisting of XA-ZB and XC-ZB:
wherein,
XA is represented by the following formula:

wherein,
$R^{XA}$ is an alkylaryl group, and each $R^{XA}$ is identical or different,
XB is represented by the following formula:

wherein,
each $R^{XB}$ is independently an unsubstituted aryl group, an alkyl-substituted aryl group, an aryl-substituted aryl group, an arylthio-substituted aryl group, an aryloxy-substituted aryl group, an unsubstituted alkyl group, an aryl-substituted alkyl group, an arylthio-substituted alkyl group, or an aryloxy substituted alkyl group,
XC is represented by the following formula:

wherein,
each $R^{XC}$ is independently an unsubstituted aryl group, an alkyl-substituted aryl group, an aryl-substituted aryl group, an arylthio-substituted aryl group, an aryloxy-substituted aryl group, an alkyloxy-substituted aryl group, a hydroxyaryl group, an alkyloxyalkyl-substituted aryl group, a carboxylate-substituted aryl group, an acyloxy-substituted aryl group, an unsubstituted alkyl group, an aryl-substituted alkyl group, an arylthio-substituted alkyl group, an alkyloxy-substituted alkyl group, a hydroxyalkyl group, a carboxylate-substituted alkyl group, or an acyloxy-substituted alkyl group, and at least one of $R^{XC}$ is an alkyloxy-substituted aryl group, a hydroxyaryl group, a carboxylate-substituted aryl group, an acyloxy-substituted aryl group, an alkyloxy-substituted alkyl group, a hydroxyalkyl group, a carboxylate-substituted alkyl group, or an acyloxy-substituted alkyl group, ZA is represented by the following formula:

$$R^{ZA}SO_3^-  \qquad (ZA)$$

wherein,
$R^{ZA}$ is a fluorine-substituted alkyl group, a fluorine-substituted alkyl ether group, a fluorine-substituted aryl group, a fluorine-substituted acyl group, or a fluorine-substituted alkoxyaryl group, ZB is represented by the following formula:

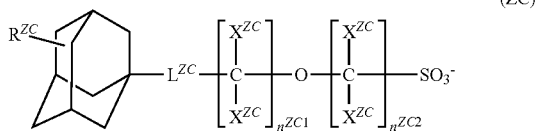

(ZB)

wherein,
each $R^{ZB}$ is independently a fluorine-substituted alkyl group, a fluorine-substituted alkyl ether group, a fluorine-substituted aryl group, a fluorine-substituted acyl group, or a fluorine-substituted alkoxyaryl group, and two $R^{ZB}$ are unbonded or bonded each other to form a fluorine-substituted heterocyclic structure, ZC is represented by the following formula:

(ZC)

wherein,
$R^{ZC}$ is a hydrogen atom, an alkyl group, an alkoxy group or a hydroxyl group,
$L^{ZC}$ is an oxy group or a carbonyloxy group,
each $X^{ZC}$ is independently a hydrogen atom or a fluorine atom,
$n^{ZC1}$ is 0 to 10, and
$n^{ZC2}$ is 0 to 21,
and wherein,
a positive charge of XA, XB or XC is combined with a negative charge of ZA, ZB or ZC.

Further, the method for forming a resist pattern according to the present invention comprises:
a step of coating the above-described chemically amplified positive type photoresist composition on a substrate to form a coating film,
a step of subjecting the coating film to image-wise exposure, and
a step of developing the exposed coating film with an alkaline aqueous solution.

Effects of the Invention

According to the present invention, it is possible to form a pattern having an excellent shape, cross-sectional shape of which is nearer to a rectangular shape. In particular, even when a resist pattern having a thick film is formed, the trench widths become substantially the same between the part in the vicinity of the surface and the part in the vicinity of the bottom surface of the trench part, and in the case of forming a device or the like using the resist pattern, a device with higher accuracy can be obtained.

BRIEF DESCRIPTION OF THE DRAWINGS

FIG. 1 is a schematic diagram showing a cross-sectional shape of a resist pattern.

DETAILED DESCRIPTION OF THE INVENTION

Mode for Carrying Out the Invention

Embodiments of the present invention are described below in detail.

<Chemically Amplified Positive Type Photoresist Composition>

The chemically amplified positive type photoresist composition according to the present invention (hereinafter sometimes simply referred to as the composition) comprises a polymer, an organic solvent, and two kinds of photoacid generators. These components are described below.

[Polymer which Reacts with Acid to Increase Solubility in Alkaline Aqueous Solution]

The polymer (A) used in the present invention reacts with an acid to increase its solubility in an alkaline aqueous solution. Such a polymer has, for example, an acid group protected by a protective group, and when an acid is added from the outside, its protective group is eliminated and the solubility in an alkaline aqueous solution increases. Such a polymer can be freely selected from those commonly used in lithography method.

In the present invention, among such polymers, those having repeating units represented by the following formulae are preferable:

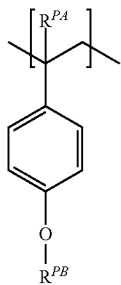
(P3)

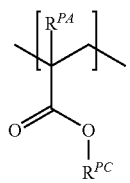
(P4)

wherein,
$R^{PA}$ is a hydrogen atom or an alkyl group,
$R^{PB}$ is an alkyl group or an alkyl ether group, and
$R^{PC}$ is an alkyl group.

Here, $R^{PA}$ is preferably hydrogen or an alkyl group having 1 to 3 carbon atoms, and is preferably hydrogen or a methyl group.

In addition, when $R^{PB}$ is an alkyl group, it is preferably an alkyl group having 4 to 12 carbon atoms. Further, it preferably has a branched structure, and particularly preferred one is a tertiary alkyl group. When $R^{PB}$ is an alkyl ether group, it has or has not a branched structure, or has or has not a structure having an alkoxy group in the side chain of the carbon chain, or an acetal or ketal structure.

$R^{PC}$ is preferably an alkyl group having 4 to 12 carbon atoms, preferably has a branched structure, and preferably has a tertiary carbon or a quaternary carbon.

Since these repeating units are suitably formulated according to the purpose, the formulating ratio thereof is not particularly limited, but it is preferable to formulate so that the rate of increase in solubility in an alkaline aqueous solution by acid becomes appropriate. Specifically, since, among the above-described ones, (P3) and (P4) react with an acid to change their solubility, the total polymerization ratio of (P3) or (P4) out of all the repeating units is preferably 5 to 50 mol %, more preferably 10 to 40 mol %.

In addition, although the molecular weight of such a polymer is not particularly limited, in general, its mass average molecular weight is preferably 2,000 to 200,000, more preferably 4,000 to 200,000. Here, the mass average molecular weight means a mass average molecular weight in terms of polystyrene as measured by gel permeation chromatography.

These polymers can be used in combination of two or more kinds of them.

In addition, any repeating unit having a structure other than (P1) to (P4) is uncombined or combined with the above-described repeating unit, but the polymerization ratio thereof is preferably 20 mol % or less

[Organic Solvent]

The composition according to the present invention comprises an organic solvent (B). The organic solvent is not particularly limited as long as it can dissolve the components to be formulated, and can be freely selected from those commonly used in lithography method. Specific examples include ethylene glycol monoalkyl ethers such as ethylene glycol monomethyl ether and ethylene glycol monoethyl ether; ethylene glycol monoalkyl ether acetates such as ethylene glycol monomethyl ether acetate and ethylene glycol monoethyl ether acetate; propylene glycol monoalkyl ethers such as propylene glycol monomethyl ether (hereinafter sometimes referred to as PGME) and propylene glycol monoethyl ether; propylene glycol monoalkyl ether acetates such as propylene glycol monomethyl ether acetate (hereinafter sometimes referred to as PGMEA) and propylene glycol monoethyl ether acetate; lactates such as methyl lactate and ethyl lactate (hereinafter sometimes referred to as EL); aromatic hydrocarbons such as toluene and xylene; ketones such as methyl ethyl ketone, 2-heptanone and cyclohexanone; amides such as N,N-dimethylacetamide and N-methylpyrrolidone; lactones such as γ-butyrolactone; and the like. These organic solvents can be used alone or in combination of two or more kinds of them.

In the composition according to the present invention, the formulating ratio of the organic solvent is adjusted in accordance with the coating method of the composition and the targeted film thickness, and is, for example, 100 to 900 parts by mass, more preferably 100 to 700 parts by mass, based on 100 parts by mass of the polymer component.

[Photoacid Generator]

The composition according to the present invention comprises photoacid generators. The photoacid generator generates acid upon irradiation with light and is well known in the field of lithography. The photoacid generators used in the composition according to the present invention is freely selected from conventionally known ones, but it is necessary to combine specific photoacid generators. The photoacid generator used in the present invention is an onium salt, particularly an iodonium salt or a sulfonium salt. The onium salt is composed of a cation moiety and an anion moiety. In the present invention, the first photoacid generator (C) and the second photoacid generator (D) are comprised, but each is characterized by being composed of a specific cation and a specific anion, respectively.

Specifically, when each symbol represents as shown below:
XA: iodonium ion (cation),
XB: sulfonium ion (cation) having no specific group,
XC: sulfonium ion (cation) having specific group(s),
ZA: fluorinated sulfonate ion (anion),
ZB: fluorinated sulfonimide (anion), and
ZC: sulfonate ion (anion) having an adamantane skeleton,
then, the first photoacid generator (C) is selected from the group consisting of XA-ZA, XB-ZA, XB-ZB, XB-ZC, and XC-ZA, and
the second photoacid generator (D) is selected from the group consisting of XA-ZB and XC-ZB.

Each ion is described below in detail.

First, the iodonium ion XA is represented by the following formula:

$$R^{XA}-I^+-R^{XA} \qquad (XA)$$

wherein,
$R^{XA}$ is an alkylaryl group, preferably an alkylphenyl group. Here, the alkyl group preferably has 4 to 12 carbon atoms and has an unbranched or a branched structure.

Although each $R^{XA}$ in the formula is identical or different, those which are identical are easily available.

In such an iodonium ion XA, preferable ones are as follows:

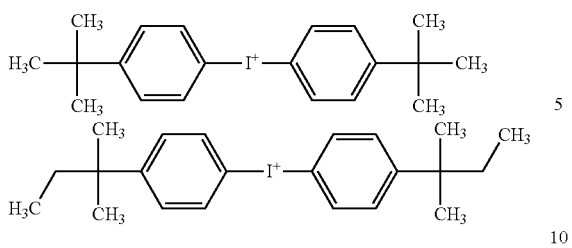

The sulfonium ion XB is represented by the following formula:

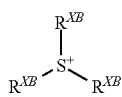

(XB)

wherein, each $R^{XB}$ independently represents an unsubstituted aryl group, an alkyl-substituted aryl group, an aryl-substituted aryl group, an arylthio-substituted aryl group, an aryloxy-substituted aryl group, an unsubstituted alkyl group, an aryl-substituted alkyl group, an arylthio-substituted alkyl group, or an aryloxy-substituted alkyl group.

When $R^{XB}$ is an unsubstituted or substituted aryl group, the carbon number thereof is preferably 6 to 15. Specific examples of such an unsubstituted or substituted aryl group include a phenyl group, an alkylphenyl group such as a t-butylphenyl group, a phenyl thioether group ($C_6H_5$—S—$C_6H_4$—), or a phenyl ether group ($C_6H_5$—O—$C_6H_4$—). When $R^{XB}$ is an unsubstituted or substituted alkyl group, the carbon number thereof is preferably 1 to 10. Specific examples of such an unsubstituted or substituted alkyl group include a methyl group, an ethyl group, a propyl group, a butyl group, or a benzyl group.

Each $R^{XB}$ in the formula is identical or different.

In such a sulfonium ion XB, preferable ones are as follows:

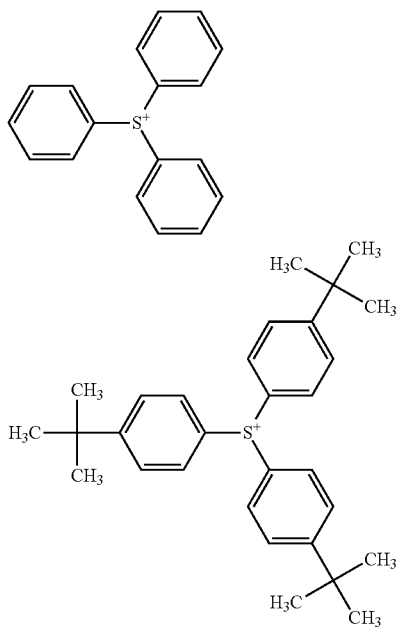

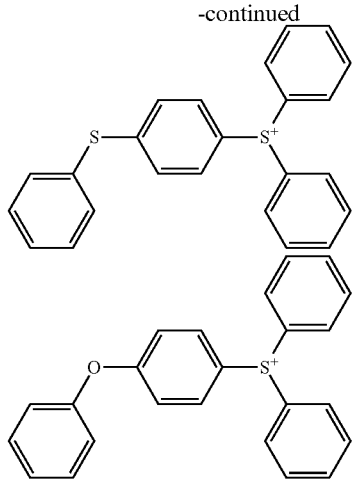

The sulfonium ion XC is represented by the following formula:

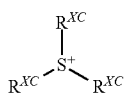

(XC)

wherein, each $R^{XB}$ independently represents an unsubstituted aryl group, an alkyl-substituted aryl group, an aryl-substituted aryl group, an arylthio-substituted aryl group, an aryloxy-substituted aryl group, an alkyloxy-substituted aryl group, a hydroxyaryl group, an alkyloxyalkyl-substituted aryl group, a carboxylate-substituted aryl group, an acyloxy-substituted aryl group, an unsubstituted alkyl group, an aryl-substituted alkyl group, an arylthio-substituted alkyl group, an alkyloxy-substituted alkyl group, a hydroxyalkyl group, a carboxylate-substituted alkyl, or an acyloxy-substituted alkyl group, and at least one of $R^{XC}$ is an alkyloxy-substituted aryl group, a hydroxyaryl group, a carboxylate-substituted aryl group, an acyloxy-substituted aryl group, an alkyloxy-substituted alkyl group, a hydroxyalkyl group, a carboxylate-substituted alkyl group, or an acyloxy-substituted alkyl group. When $R^{XC}$ is an unsubstituted or substituted aryl group, the carbon number thereof is preferably 6 to 15. Specific examples of such an unsubstituted or substituted aryl group include a phenyl group, an alkylphenyl group such as a t-butylphenyl group, a phenyl thioether group, a phenyl ether group, a methoxyphenyl group, or an ethoxyphenyl group. When $R^{XC}$ is an unsubstituted or substituted alkyl group, the carbon number thereof is preferably 1 to 10. Specific examples of such an unsubstituted or substituted alkyl group include a methyl group, an ethyl group, a propyl group, a butyl group, a benzyl group, or a methoxyethyl group.

Each $R^{XC}$ in the formula may be identical or different, and at least one of $R^{XC}$ is required to be an aryl group or an alkyl group, which is substituted with alkyloxy, hydroxy, alkyloxyalkyl, carboxylate or acyloxy, for example, a methoxyphenyl group, a t-butoxyphenyl group or a methoxyethyl group.

In such a sulfonium ion XC, preferable ones are as follows:

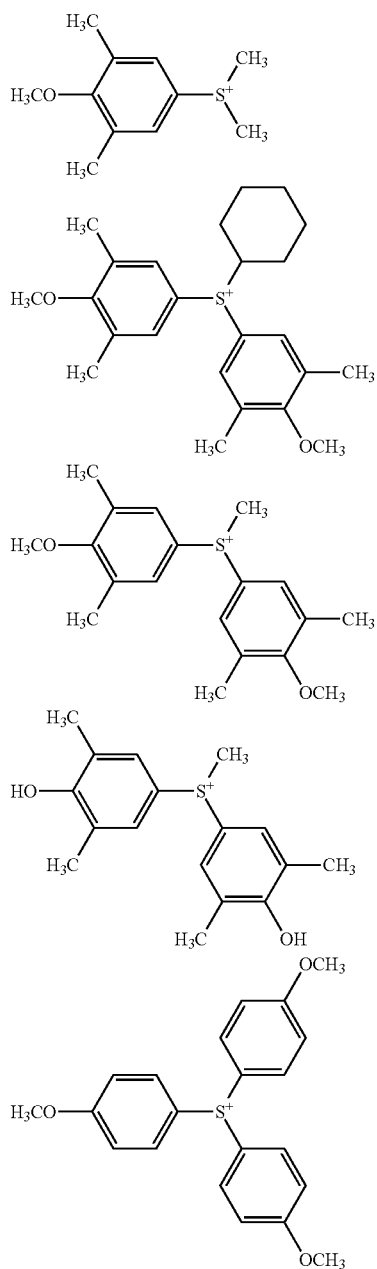

The fluorinated sulfonate ion ZA is represented by the following formula:

wherein, $R^{ZA}$ is a fluorine-substituted alkyl group, a fluorine-substituted alkyl ether group, a fluorine-substituted aryl group, a fluorine-substituted acyl group, or a fluorine-substituted alkoxyaryl group. Here, the number of carbon atoms contained in $R^{ZA}$ is preferably 1 to 10. Further, $R^{ZA}$ is fluorinated, and at least one hydrogen is substituted with fluorine. In particular, when $R^{ZA}$ is a fluorinated alkyl group, the carbon number thereof is preferably 1 to 10, more preferably 2 to 6. Furthermore, it is preferably a perfluoroalkyl group, in which all of the hydrogens are substituted with fluorine.

In such a sulfonate ions preferred ones are $C_4F_9SO_3^-$, $C_3F_7SO_3^-$ and the like.

Further, the fluorinated amine ion ZB is represented by the following formula:

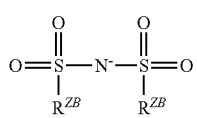

wherein, each $R^{ZB}$ independently represents a fluorine-substituted alkyl group, a fluorine-substituted alkyl ether group, a fluorine-substituted aryl group, a fluorine-substituted acyl group, or a fluorine-substituted alkoxyaryl group, and two $R^{ZB}$ are unbonded or bonded each other to form a fluorine-substituted heterocyclic structure. Here, the number of carbon atoms contained in $R^{ZB}$ is preferably 1 to 10. Further, $R^{ZB}$ is fluorinated, and at least one hydrogen is substituted with fluorine. In particular, when $R^{ZB}$ is a fluorinated alkyl group, the carbon number thereof is preferably 1 to 10, more preferably 2 to 6. Furthermore, it is preferably a perfluoroalkyl group, in which all of the hydrogens are substituted with fluorine.

Each $R^{ZB}$ in the formula is identical or different.

Further, two $R^{ZB}$ are unbonded or bonded each other to form a fluorine-substituted heterocyclic structure. Here, the heterocycle is monocyclic or polycyclic. The number of the members of the heterocycle is preferably 5 to 20, and it is preferably a monocyclic structure having 5 to 8 members.

Here, $R^{ZB}$ is generally composed of a fluorine-substituted hydrocarbon chain, but it is preferably a perfluoroalkylene. In addition, $R^{ZB}$ can further contain a hetero atom.

In such an anion ZB, preferable ones are as follows:

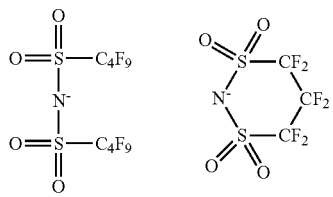

The sulfonate ion ZC having an adamantane skeleton is represented by the following formula:

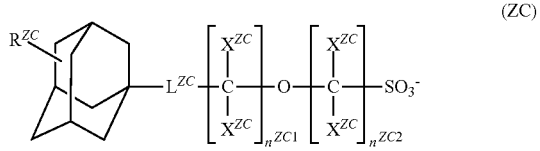

wherein, $R^{ZC}$ is a hydrogen atom, an alkyl group, an alkoxy group, or a hydroxyl group. When $R^{ZC}$ is an alkyl group or an alkoxy group, the carbon number thereof is preferably 1 to 6.

Further, $L^{ZC}$ is a bivalent linking group, and is an oxy group or a carbonyloxy group.

Each $X_{ZC}$ independently represents a hydrogen atom or a fluorine atom.

Further, $n^{ZC1}$ is 0 to 10, and $n^{ZC2}$ is 0 to 21.

Preferred examples of such an ion ZC are as follows:

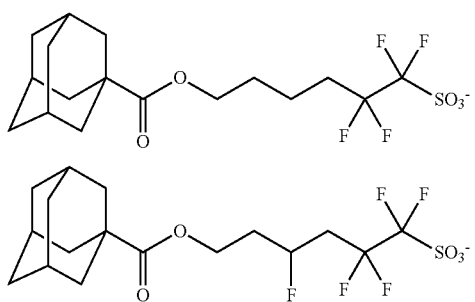
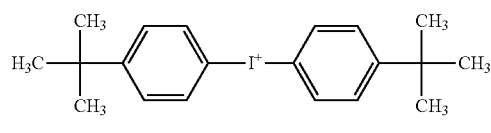
Further, preferred examples of the first photoacid generator composed of these ions are as follows:
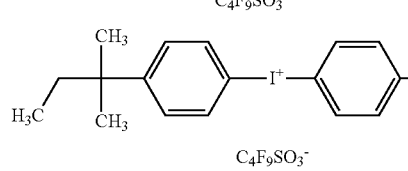
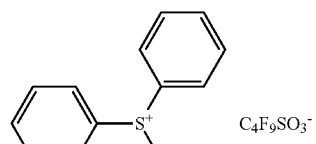
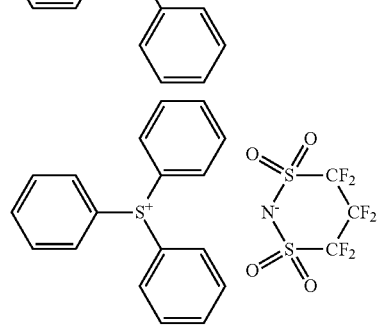
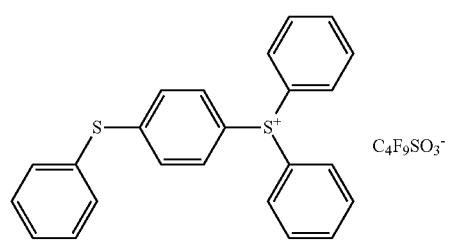
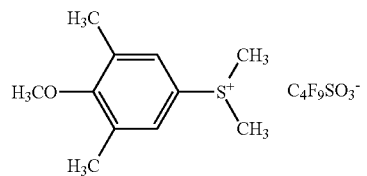
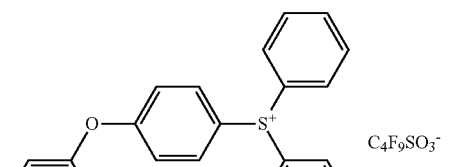
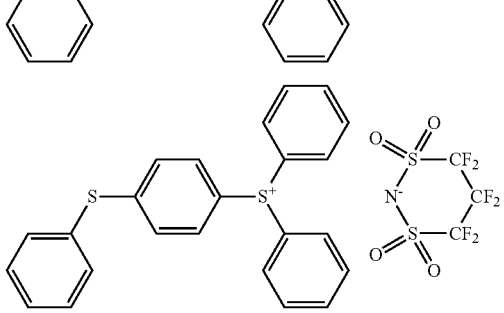
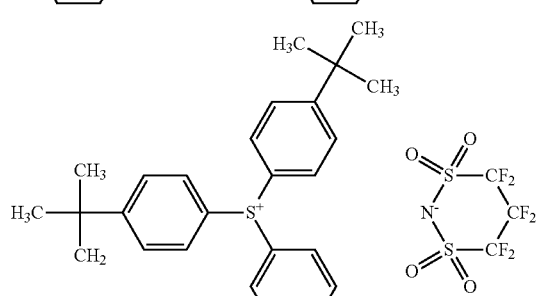
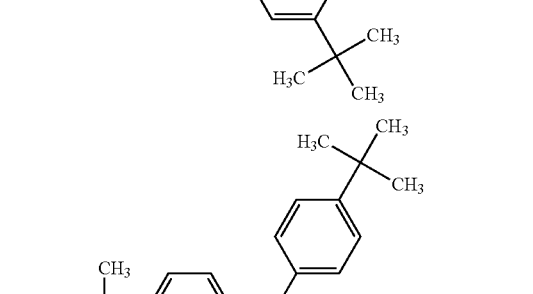
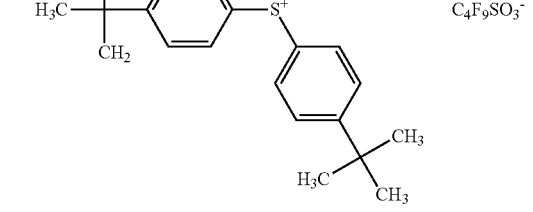
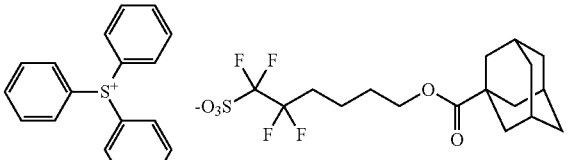
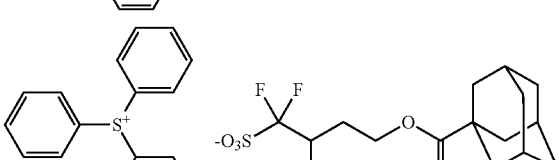

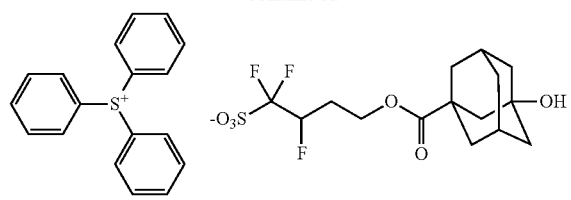

Furthermore, preferred examples of the second photoacid generator composed of the above-described ions are as follows:

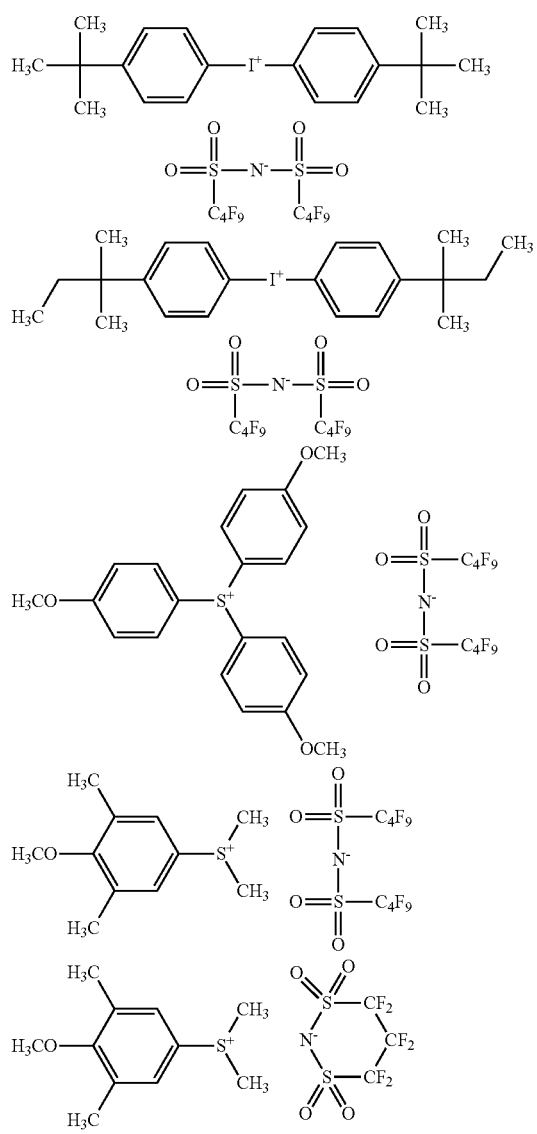

In addition, these photoacid generators are composed of XA, XB or XC having a positive charge, and ZA, ZB or ZC having a negative charge, in which they are combined by a positive charge and a negative charge thereof.

The formulated ratio of the first photoacid generator and the second photoacid generator is adjusted in accordance with their types. In general, however, the formulating ratio of the second photoacid generator based on the mass of the first photoacid generator is preferably 0.1 to 11 times, more preferably 0.3 to 9 times.

Further, the formulating amount of the first photoacid generator and the second photoacid generator with respect to the composition is preferably 0.5 to 10 parts by mass, more preferably 1 to 10 parts by mass, based on 100 parts by mass.

In the present invention, by combining specific photoacid generators composed of these ions, it is possible to form a resist pattern having a cross-sectional shape near to a rectangular shape. The reason is not yet sufficiently elucidated, but it is presumed as described below. First, in a coating film coated with a resist composition comprising a photoacid generator, the distribution of the photoacid generator varies in the depth direction, and as the result, it is presumed that the distribution of the acid released by exposure also varies in the depth direction. That is, when the photoacid generator is localized in the vicinity of the surface of the resist coating film, the pattern width of the formed resist pattern becomes narrow in the vicinity of the surface. On the other hand, when the photoacid generator is localized at the bottom of the resist coating film, the pattern width of the resist pattern to be formed becomes narrow in the vicinity of the bottom surface. Since the distribution range of the photoacid generator is narrow in the case of thin film thickness, the variation in quantity between the part with photoacid generators is large in quantity and the part with photoacid generators is small in quantity becomes smaller, and it becomes easy to obtain a pattern near to a rectangular shape. However, since the surface of the resist composition coating film is separated from the bottom surface in the case of thick film thickness, the variation in quantity between the part with photoacid generator is large in quantity and the part with photoacid generator is small in quantity becomes larger, and it becomes difficult for the pattern shape to be a rectangular shape. On the other hand, in the present invention, by combining two kinds of specific photoacid generators, the difference in pattern widths between the vicinity of the surface and the vicinity of the bottom surface can be reduced, and furthermore, since the pattern width is neither narrowed nor widened at the intermediate part thereof, an excellent pattern shape can be achieved. Even if two types of photoacid generators are merely combined, the difference in pattern widths between the vicinity of the surface and the vicinity of the bottom surface cannot be sufficiently resolved. Or, the pattern width may adversely become narrower or wider in the intermediate part, even when the difference in pattern widths between the vicinity of the surface and the vicinity of the bottom becomes smaller. In the present invention, taking balance of the two kinds specific of photoacid generators, a pattern having an excellent shape can be obtained.

In addition, such effects tend to be remarkably exhibited when, in the first photoacid generator and the second photoacid generator, both of the cations are iodonium ions, or when, in the first photoacid generator and the second photoacid, both of the cations are sulfonium ions. Following cases are preferred:
(1) a case when the first photoacid generator is XA-ZA, and the second photoacid generator is XA-ZB, and
(2) a case when the first photoacid generator is XB-ZA, XB-ZB, XB-ZC or XC-ZA, and the second photoacid generator is XC-ZB.

Further, the first photoacid generators and the second photoacid generators can be combined, respectively in multiple. For example, a combination of XA-ZA and XB-ZA can be used as the first photoacid generator, and two kinds of photoacid generators included in XA-ZA can be combined.

[Other Components]

The composition according to the present invention can contain other components as necessary. Such components include (E) a basic organic compound, (F) the third photoacid generator, and (G) a weak acid.

The basic organic compound (E) has an effect of suppressing diffusion of the acid generated in the exposed part and that of suppressing acid deactivation of the film surface by the amine component contained in air by adding a base to the composition. Examples of such a basic organic compound include:

(i) ammonia;

(ii) primary aliphatic amines having 1 to 16 carbon atoms, such as methylamine, ethylamine, isopropylamine, tert-butylamine, cyclohexylamine, ethylenediamine and tetraethylenediamine, and derivatives thereof;

(iii) secondary aliphatic amines having 2 to 32 carbon atoms, such as dimethylamine, diethylamine, methylethylamine, dicyclohexylamine and N,N-dimethylmethylenediamine, and derivatives thereof;

(iv) tertiary aliphatic amines having 3 to 48 carbon atoms, such as trimethylamine, triethylamine, dimethylethylamine, tricyclohexylamine, N,N,N',N'-tetramethylethylenediamine, N,N,N',N'',N''-pentamethyldiethylenetriamine, tris[2-(dimethylamino)ethyl]amine and tris[2-(2-methoxyethoxy)ethyl]amine, and derivatives thereof;

(v) aromatic amines having 6 to 30 carbon atoms, such as aniline, benzylamine, naphthylamine, N-methylaniline, 2-methylaniline, 4-aminobenzoic acid and phenylalanine, and derivatives thereof;

(vi) heterocyclic amines having 5 to 30 carbon atoms, such as pyrrole, oxazole, thiazole, imidazole, 4-methylimidazole, pyridine and methylpyridine, and derivatives thereof; and the like.

Such a basic compound is preferably 0 to 2 parts by mass, more preferably 0.01 to 1 part by mass, based on 100 parts by mass of the polymer component.

In addition, a weak acid (G) can be used in combination with the basic organic compound (E).

Through using these by combining each other, the distribution of the basic organic compound in the film becomes uniform and the resolution can be improved. Examples of such a weak acid include salicylic acid, formic acid, acetic acid, propionic acid, oxalic acid, malonic acid, succinic acid, and adipic acid and the like. Such a weak acid is preferably 0.01 to 5 parts by mass, more preferably 0.01 to 2 parts by mass, based on 100 parts by mass of the polymer component.

In addition, the composition of the present invention can contain the third photoacid generator that is different from the first photoacid generator or the second photoacid generator.

As such the third acid generator, an onium salt containing a weak acid ion is preferable. Since such a photoacid generator is less acidic than the first photoacid generator or the second photoacid generator, which contains fluorinated sulfonic acid in an anion, the photoacid generator causes ion exchange with an acid generated after exposure. It has an effect of incorporating a fluorinated sulfonic acid. Therefore, as well as the basic compound, it is considered that there is an effect of preventing acid diffusion. Preferred examples of the third photoacid generator are as follows:

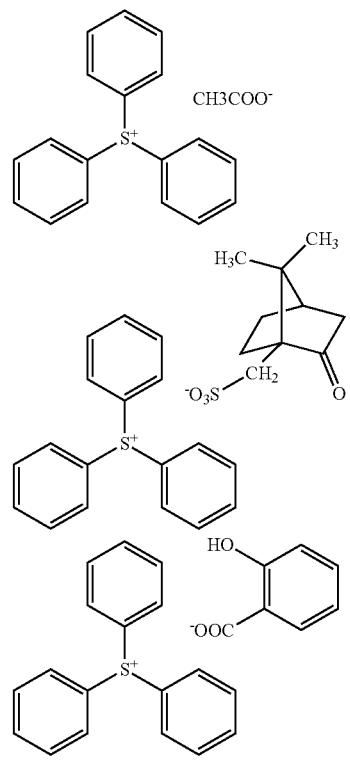

The third photoacid generator is used in an amount that does not impair the effect of the first photoacid generator and the second photoacid generator. Specifically, the amount of the third photoacid generator is preferably 0.05 to 5 parts by mass, more preferably 0.05 to 1 parts by mass, based on 100 parts by mass of the polymer component.

The composition according to the present invention optionally contains a surfactant. Coatability of the composition can be improved by the surfactant. Examples of the surfactant that can be used for the composition according to the present invention include a nonionic surfactant, an anionic surfactant, an amphoteric surfactant, and the like.

Examples of the nonionic surfactant include polyoxyethylene alkyl ethers such as polyoxyethylene lauryl ether, polyoxyethylene oleyl ether and polyoxyethylene cetyl ether; polyoxyethylene fatty acid diesters; polyoxy fatty acid monoesters; polyoxyethylene-polyoxypropylene block polymers; acetylene alcohols; acetylene glycol; polyethoxylates of acetylene alcohols; acetylene glycol derivatives such as polyethoxylates of acetylene glycol; fluorine-containing surfactants such as Fluorad (trade name, manufactured by Sumitomo 3M Ltd.), Megaface (trade name, manufactured by DIC Corporation) and Surufuron (trade name, manufactured by Asahi Glass Co., Ltd.); or organosiloxane surfactants such as KF-53 (trade name, manufactured by Shin-Etsu Chemical Co., Ltd.), and the like. Examples of the above-mentioned acetylene glycol include 3-methyl-1-butyne-3-ol, 3-methyl-1-pentyne-3-ol, 3,6-dimethyl-4-octyne-3,6-diol, 2,4,7,9-tetramethyl-5-decyne-4,7-diol, 3,5-dimethyl-1-hexyne-3-ol, 2,5-dimethyl-3-hexyne-2,5-diol, 2,5-dimethyl-2,5-hexanediol, and the like.

Further, examples of the anionic surfactant include ammonium salts or organic amine salts of alkyldiphenyl ether disulfonic acids; ammonium salts or organic amine salts of alkyldiphenyl ether sulfonic acids; ammonium salts or organic amine salts of alkylbenzenesulfonic acids; ammonium salts or organic amine salts of polyoxyethylene alkyl ether sulfuric acids; ammonium salts or organic amine salts of alkyl sulfuric acids; and the like.

Furthermore, examples of the amphoteric surfactant include 2-alkyl-N-carboxymethyl-N-hydroxy-ethyl imidazolium betaine, lauric acid amide propylhydroxysulfone betaine, and the like.

These surfactants can be used alone or in combination of two or more, and the formulation ratio thereof is preferably 2 parts by mass or less, more preferably 1 parts by mass or less, based on 100 parts by mass of the polymer component.

The composition according to the present invention can contain a low molecular weight compound comprising a group unstable to an acid (hereinafter referred to as leaving group), which is derived from an alkali-soluble phenolic compound or a hydroxycyclic compound. The leaving group reacts with an acid generated from a photoacid generator to be desorbed from the compound, and the solubility of the compound in the alkaline aqueous solution increases, so that the contrast becomes high. Hereinafter, this compound is sometimes referred to as contrast enhancer. Such a leaving group is, for example, —$R^{r1}$, —$COOR^{r1}$, or –$R^{r2}$—$COOR^{r1}$ (wherein, $R^{r1}$, which does not contain or contains an oxygen atom between carbon and carbon, is a linear, branched or cyclic, alkyl group having 1 to 10 carbon atoms, and $R^{r2}$ is an alkylene group having 1 to 10 carbon atoms), and it can be substituted with hydrogen in the hydroxyl group bonded to the compound. Such a contrast enhancer preferably contains two or more leaving groups in the molecule. Further, its mass average molecular weight is 3,000 or less, preferably 100 to 2,000. Preferred examples of the compounds before introducing the leaving group(s) to hydroxyl group(s) are as follows:

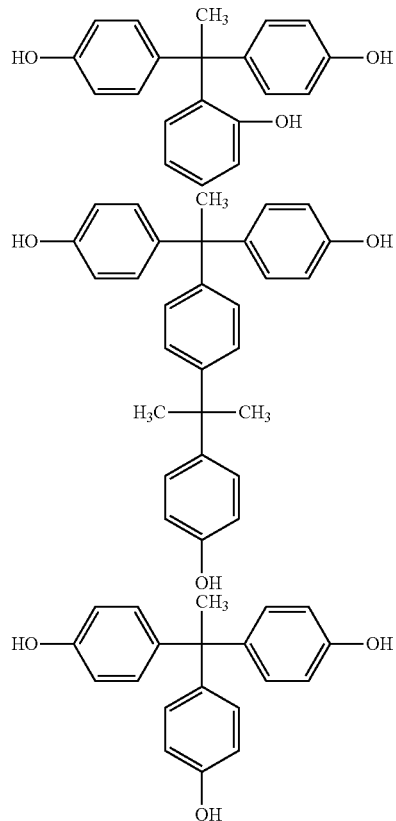

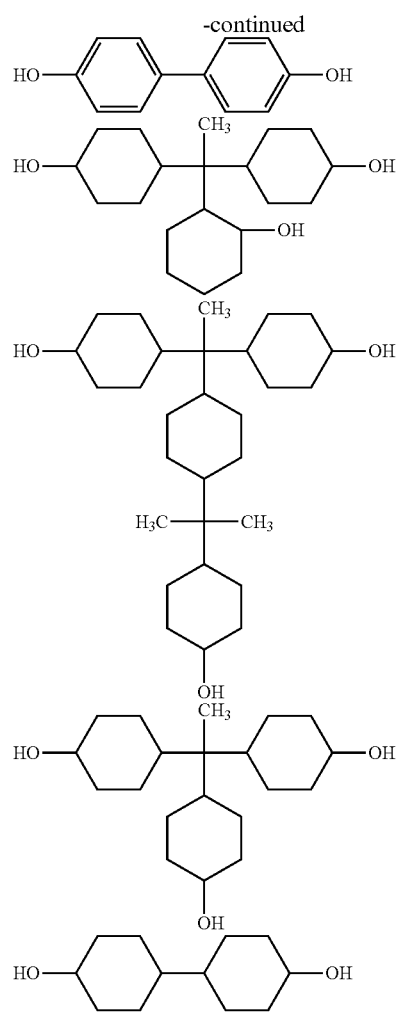

These contrast enhancers can be used alone or in combination of two or more, and the formulating ratio thereof is preferably 0.5 to 40 parts by mass, more preferably 1 to 20 parts by mass, based on 100 parts by mass of the polymer component.

Through adding these contrast enhancers, it becomes possible to increase the contrast and raise the resolution by enhancing the effect of suppressing dissolution in the unexposed part, and, dissolving by an acid in the exposed part.

Furthermore, the composition according to the present invention can further contain an alkali-soluble acrylic polymer as necessary. Examples of such a polymer include alkali-soluble polyacrylic acid esters, alkali-soluble polymethacrylic acid esters, alkali-soluble poly(acrylic acid esters.methacrylic acid esters, and the like) containing acrylic acid ester and methacrylic acid ester as a structural unit. Such an acrylic polymer can function also as a plasticizer as described later.

When an alkali-soluble acrylic polymer is used in the composition according to the present invention, its mass average molecular weight is preferably 2,000 to 200,000.

The acrylic polymer can be used in the range that does not impair the effect of the present invention, but it is generally used in an amount of 20 mass % or less of the polymer component.

Optionally, a plasticizer is further formulated in the composition according to the present invention. Examples of the plasticizer include alkali-soluble vinyl polymers and acid-dissociable group-containing vinyl polymers. More specifically, preferred examples include polyvinyl chloride, polystyrene, polyhydroxystyrene, polyvinyl acetate, polyvinyl benzoate, polyvinyl ether, polyvinyl butyral, polyvinyl alcohol, polyether ester, polyvinyl pyrrolidone, polyacrylic acid, polymethacrylic acid, polyacrylic acid ester, polyimide maleate, polyacrylamide, polyacrylonitrile, polyvinyl phenol, novolac, and copolymers thereof and the like. Particularly preferred examples include polyvinyl ether, polyvinyl butyral and polyether ester. The mass average molecular weight of the plasticizer is, in general, preferably from 500 to 200,000.

These plasticizers can be used alone or in combination of two or more, and the compounding ratio thereof is preferably 1 to 20 parts by mass, more preferably 2 to 10 parts by mass, based on 100 parts by mass of the polymer component.

Through adding these plasticizers, it becomes possible to suppress the film cracking in the case of thick film.

Optionally, the composition according to the present invention contains other additives, such as dyes and adhesion aids.

<Pattern Forming Method>

The pattern forming method according to the present invention is to form a pattern using the above-described composition, and a pattern can be formed in accordance with a conventionally known lithography method.

Specifically, the pattern forming method comprises, coating the above-described chemically amplified positive type photoresist composition on a substrate to form a coating film, subjecting the coating film to image-wise exposure, and developing the exposed coating film with an alkaline aqueous solution.

First, a resist composition is coated on the surface of a substrate such as a silicon substrate, a glass substrate or the like, which has been optionally pretreated, by a conventionally known coating method such as a spin coating method, to form a coating film of a resist composition. On the substrate, a circuit, a device, or the like can be formed. Further, prior to coating of the composition, an underlayer film is optionally formed under a resist layer by coating. Such an underlayer film is generally capable of improving the adhesion between the coating film and the substrate. In addition, through forming a layer containing a transition metal or an oxide thereof as the underlayer film, reflected light can be increased and the exposure margin can be improved.

The thickness of the coating film is selected according to the purpose, but when the composition according to the present invention is used, a pattern having a more excellent shape can be formed in the case of forming a thick film. Therefore, the thickness of the coating film is preferably thick, and, for example, it is preferably 0.9 µm or more, more preferably 2 µm or more. Further, although the upper limit is not particularly limited, it is preferably 15 µm or less, more preferably 13 µm or less, from the viewpoint of productivity and the like As the method for forming a coating film of the composition according to the present invention, any method used for coating a conventional composition, such as a spin coating method, a roll coating method, a land coating method, a spray coating method, a cast coating method and a dip coating method can be used. Further, if necessary, a coating film is formed by a method such as a screen printing. After coating, pre-baking can be carried out as necessary.

Exposure is performed by image-wise light irradiation to the obtained coating film. Examples of the radiation used for exposure include ultraviolet ray such as g-line and i-line, deep ultraviolet ray, KrF excimer laser, ArF excimer laser, X-ray, electron beam, and the like. Among these, the radiation having a short wavelength, such as deep ultraviolet ray and KrF excimer laser, is preferably used in order to form a thick film pattern.

Post-exposure bake is carried out, if necessary, to the exposed coating film, and thereafter, development is carried out with an alkaline aqueous solution. As the developing method, a method which has been conventionally used for developing a photoresist, such as a paddle developing method, an immersion developing method and a swinging immersion developing method, can be used. Examples of the developer include aqueous solutions containing inorganic alkalis such as sodium hydroxide, potassium hydroxide, sodium carbonate and sodium silicate, organic amines such as ammonia, ethylamine, propylamine, diethylamine, diethylaminoethanol, and triethylamine, quaternary amines such as tetramethylammonium hydroxide, and the like.

After developing, a pattern can be obtained by carrying out washing or rinsing treatment optionally.

Using the pattern obtained as a mask, the substrate and the like can be etched. Therefore, a semiconductor device can be manufactured by using this method.

EXAMPLE

The present invention is explained below by use of the following examples.

Example 1

Based on 100 parts by mass of Polymer A, which is a p-hydroxystyrene/styrene/t-butyl acrylate copolymer having a mass average molecular weight of 12,000 (polymerization ratio: hydroxystyrene 60%, styrene 20%, and t-butyl acrylate 20%), 0.6 parts by mass of PAG-1A that is the first acid generator, 1.0 part by mass of PAG-2A that is the second acid generator, 0.3 parts by mass of tris[2-(2-methoxyethoxy)ethyl]amine as an basic organic compound and 0.1 parts by mass of KF-53 (product name, manufactured by Shin-Etsu Chemical Co., Ltd.) as a surfactant were dissolved into 190 parts by mass of a mixed solvent composed of propylene glycol monomethyl ether and ethyl lactate (PGME:EL=70:30). The obtained solution was filtered through a 0.05 µm filter to prepare a resist composition of Example 1.

Examples 2 to 13 and Comparative Examples 1 to 15

Resist compositions of the respective Examples were prepared in the same manner as in Example 1 except that the kind and amount of each component were changed as shown in Table 1.

[Evaluation]

Using a coater/developer (Mark 8, manufactured by Tokyo Electron Limited), the prepared resist solution was dispensed onto an 8-inch silicon wafer and spin coated. Subsequently, baking was carried out on a hot plate at 150° C. for 130 seconds to obtain a resist film. When the thickness of the obtained resist film was measured using a spectrometric film thickness measurement system (M-1210 type, manufactured by Dainippon Screen Co., Ltd.), the thickness of each resist film was 4.3 µm.

The obtained resist film was exposed using a KrF stepper (FPA3000-EX5, manufactured by Canon Inc.). Then, after post-exposure bake was carried out on a hot plate at 110° C. for 160 seconds, development was carried out for 60 seconds with a 2.38% TMAH aqueous solution (product name: AZ300MIF, manufactured by Merck Co., Ltd.) to form a resist pattern having a line width of 1 μm. The cross-sectional shape of the obtained pattern was observed using a scanning electron microscope.

The cross-sectional shapes of the obtained patterns were, for example, the shapes shown in (a) to (f) of FIG. 1. The ratio of the pattern width $W_T$ at the surface part with respect to the pattern width $W_B$ at the bottom part of the obtained pattern was defined as the pattern size ratio R. Further, when the surface part of the pattern is removed by development (FIG. 1 (f)), the pattern size ratio R becomes zero. The pattern size ratio R thus obtained was as shown in Table 1.

TABLE 1

| | Polymer (parts by mass) | First photoacid generator (parts by mass) | Second photoacid generator (parts by mass) | Basic organic compound (parts by mass) | Third photoacid generator (parts by mass) | Weak acid (parts by mass) | Contrast enhancer (parts by mass) | Plasticizer (parts by mass) | Surfactant (parts by mass) | Pattern size ratio R |
|---|---|---|---|---|---|---|---|---|---|---|
| Example 1 | Polymer A (100) | PAG-1A (0.6) | PAG-2A (1.0) | TMEA (0.3) | — | — | — | — | KF-53 (0.1) | 0.92 |
| Example 2 | Polymer A (100) | PAG-1B (0.6) | PAG-2B (1.0) | TMEA (0.3) | — | — | — | — | KF-53 (0.1) | 0.91 |
| Example 3 | Polymer A (100) | PAG-1C (1.0) | PAG-2C (1.4) | TMEA (0.1) | — | — | — | — | KF-53 (0.1) | 0.93 |
| Example 4 | Polymer A (100) | PAG-1D (1.0) | PAG-2E (1.4) | TMEA (0.1) | — | — | — | — | KF-53 (0.1) | 0.94 |
| Example 5 | Polymer A (100) | PAG-1E (1.0) | PAG-2D (1.4) | TMEA (0.1) | — | — | — | — | KF-53 (0.1) | 0.95 |
| Example 6 | Polymer A (100) | PAG-1F (0.5) | PAG-2D (1.9) | TMEA (0.1) | — | — | — | — | KF-53 (0.1) | 0.91 |
| Example 7 | Polymer A (100) | PAG-1G (1.2) | PAG-2D (1.2) | TMEA (0.1) | — | — | — | — | KF-53 (0.1) | 0.93 |
| Example 8 | Polymer B (100) | PAG-1G (0.5) | PAG-2D (1.9) | TMEA (0.1) | — | — | — | — | KF-53 (0.1) | 0.93 |
| Example 9 | Polymer C (100) | PAG-1G (1.2) | PAG-2D (1.2) | TMEA (0.1) | — | — | — | — | KF-53 (0.1) | 0.92 |
| Example 10 | Polymer A (100) | PAG-1G (0.5) | PAG-2D (1.9) | TMEA (0.1) | TPS-SA (0.1) | — | — | — | KF-53 (0.1) | 0.91 |
| Example 11 | Polymer A (100) | PAG-1G (0.5) | PAG-2D (1.9) | — | TPS-SA (0.2) | — | — | — | KF-53 (0.1) | 0.94 |
| Example 12 | Polymer A (100) | PAG-1G (1.2) | PAG-2D (1.2) | TMEA (0.1) | — | SA (0.05) | — | — | KF-53 (0.1) | 0.90 |
| Example 13 | Polymer A (100) | PAG-1G (1.2) | PAG-2D (1.2) | TMEA (0.1) | — | — | TBPE (2.0) | — | KF-53 (0.1) | 0.97 |
| Example 14 | Polymer A (100) | PAG-1G (1.2) | PAG-2D (1.2) | TMEA (0.1) | — | — | — | PVME (2.0) | KF-53 (0.1) | 0.91 |
| Comparative Example 1 | Polymer A (100) | PAG-1A (2.4) | — | TMEA (0.3) | — | — | — | — | KF-53 (0.1) | 0.74 |
| Comparative Example 2 | Polymer A (100) | PAG-1B (2.5) | — | TMEA (0.3) | — | — | — | — | KF-53 (0.1) | 0.72 |
| Comparative Example 3 | Polymer A (100) | — | PAG-2A (3.4) | TMEA (0.3) | — | — | — | — | KF-53 (0.1) | 1.18 |
| Comparative Example 4 | Polymer A (100) | — | PAG-2B (3.5) | TMEA (0.3) | — | — | — | — | KF-53 (0.1) | 1.17 |
| Comparative Example 5 | Polymer A (100) | PAG-1C (2.0) | — | TMEA (0.1) | — | — | — | — | KF-53 (0.1) | 0.18 |
| Comparative Example 6 | Polymer A (100) | PAG-1D (1.9) | — | TMEA (0.1) | — | — | — | — | KF-53 (0.1) | 0.43 |
| Comparative Example 7 | Polymer A (100) | PAG-1E (2.4) | — | TMEA (0.1) | — | — | — | — | KF-53 (0.1) | 0.48 |
| Comparative Example 8 | Polymer A (100) | PAG-1F (2.3) | — | TMEA (0.1) | — | — | — | — | KF-53 (0.1) | 0.00 |
| Comparative Example 9 | Polymer A (100) | PAG-1G (1.7) | — | TMEA (0.1) | — | — | — | — | KF-53 (0.1) | 0.74 |
| Comparative Example 10 | Polymer A (100) | — | PAG-2C (3.2) | TMEA (0.1) | — | — | — | — | KF-53 (0.1) | 1.24 |
| Comparative Example 11 | Polymer A (100) | — | PAG-2D (2.7) | TMEA (0.1) | — | — | — | — | KF-53 (0.1) | 1.19 |
| Comparative Example 12 | Polymer A (100) | — | PAG-2E (1.7) | TMEA (0.1) | — | — | — | — | KF-53 (0.1) | 1.12 |
| Comparative Example 13 | Polymer B (100) | PAS-1A (2.4) | — | TMEA (0.3) | — | — | — | — | KF-53 (0.1) | 0.54 |
| Comparative Example 14 | Polymer C (100) | PAG-1A (2.4) | — | TMEA (0.3) | — | — | — | — | KF-53 (0.1) | 0.71 |

In the table:

Polymer A: p-hydroxystyrene (60) styrene (20) t-butyl acrylate (20) copolymer, mass average molecular weight 12,000;

Polymer B: p-hydroxystyrene (66) p-t-butoxystyrene (22) t-butyl acrylate (12) copolymer, mass average molecular weight 13,000;

Polymer C: p-hydroxystyrene (70) p-(1-ethoxyethoxy) styrene (10) t-butyl acrylate (20) copolymer, mass average molecular weight 12,000;
TMEA: tris[2-(2-methoxyethoxy)ethyl]amine;
TPS-SA: triphenylsulfonium salicylate;
SA: salicylic acid;
TBPE: 1,1,1-tris(4-t-butoxycarbonyloxyphenyl)ethane; and
PVME: polyvinyl methyl ether (Lutonal M40 (trade name, manufactured by BASF)), mass average molecular weight 50,000.
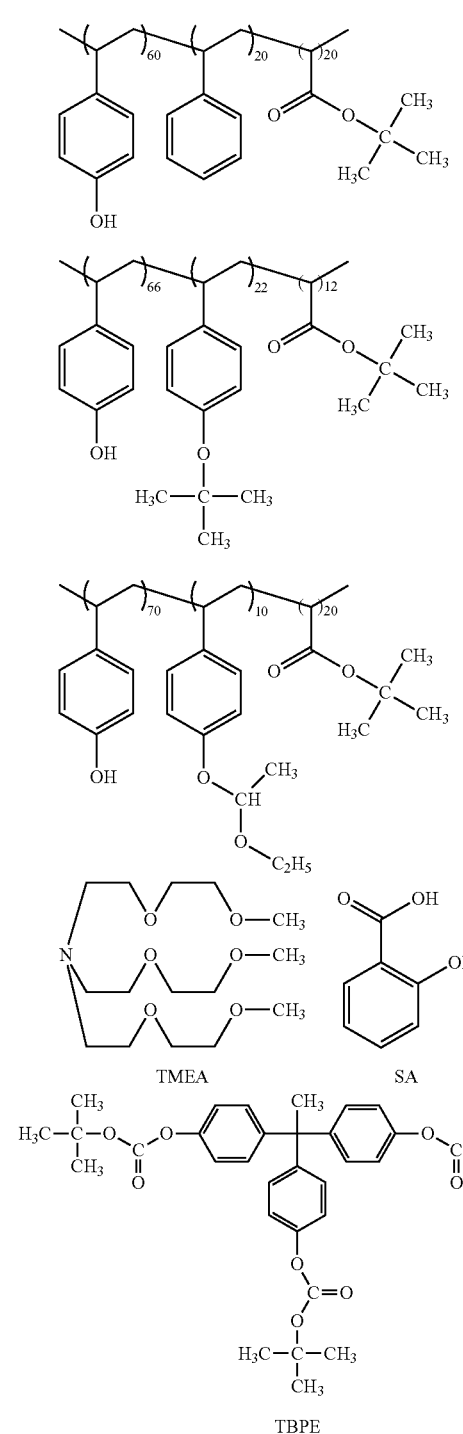
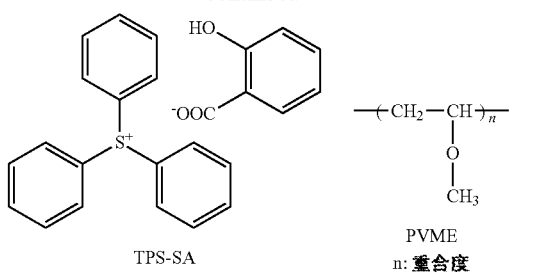
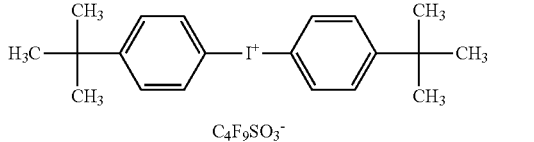
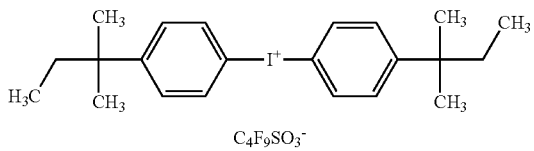
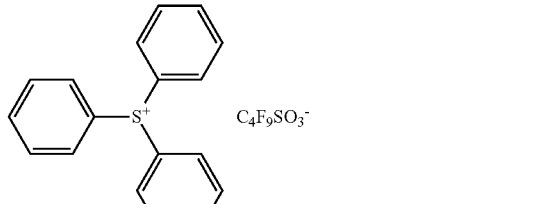
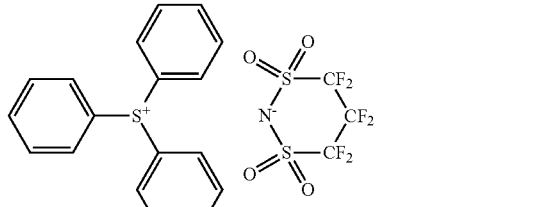
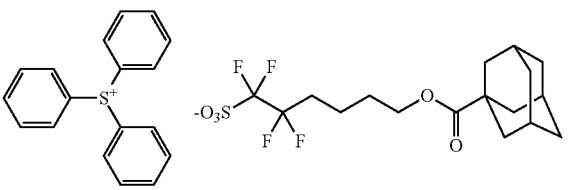
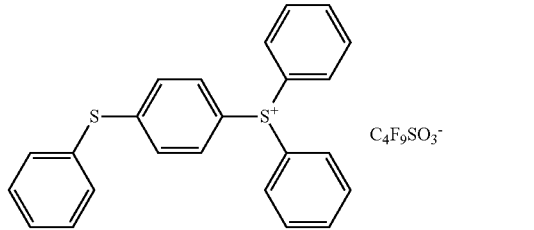

-continued

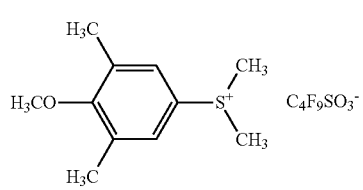
PAG-1G

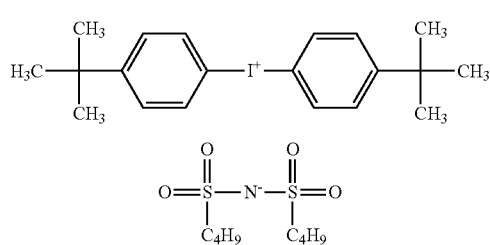
PAG-2A

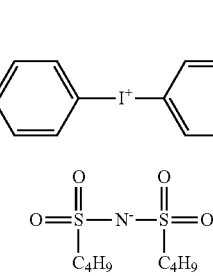

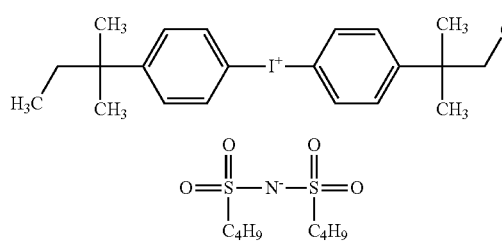
PAG-2B

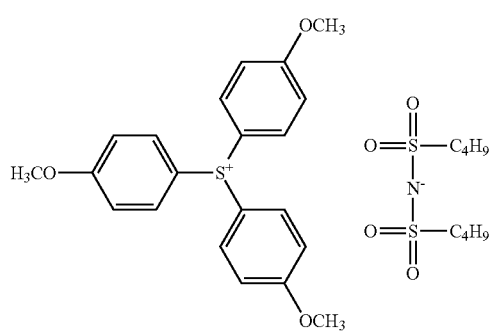
PAG-2C

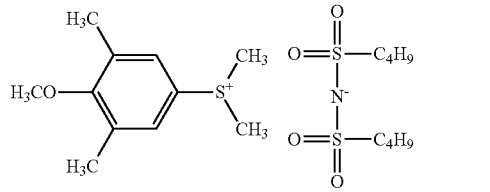
PAG-2D

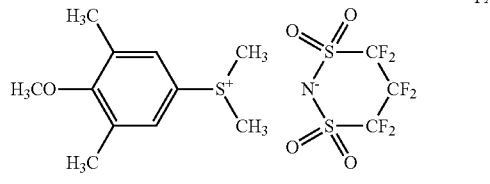
PAG-2E

The invention claimed is:
1. A chemically amplified positive type photoresist composition comprising:
(A) a polymer which reacts with an acid to increase its solubility in an alkaline aqueous solution,
(B) an organic solvent,
(C) a first photoacid generator is XA-ZA, and
(D) a second photoacid generator is XA-ZB: wherein,
XA is represented by the following formula:

$$R^{XA}-I^+-R^{XA} \quad (XA)$$

wherein,
$R^{XA}$ is an alkylaryl group, and each $R^{XA}$ is identical or different,
ZA is represented by the following formula:

$$R^{ZA}SO_3^- \quad (ZA)$$

wherein,
$R^{ZA}$ is a fluorine-substituted alkyl group, a fluorine-substituted alkyl ether group, a fluorine-substituted aryl group, a fluorine-substituted acyl group, or a fluorine-substituted alkoxyaryl group,
ZB is represented by the following formula:

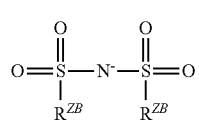
(ZB)

wherein,
each $R^{ZB}$ is independently a fluorine-substituted alkyl group, a fluorine-substituted alkyl ether group, a fluorine-substituted aryl group, a fluorine-substituted acyl group, or a fluorine-substituted alkoxyaryl group, and two $R^{ZB}$ are unbonded or bonded each other to form a fluorine-substituted heterocyclic structure,
and wherein,
a positive charge of XA is combined with a negative charge of ZA or ZB and
wherein the polymer comprises repeating units selected from the group consisting of the following formulae (P1) to (P4):

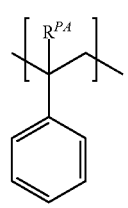
(P1)

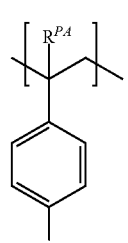
(P2)

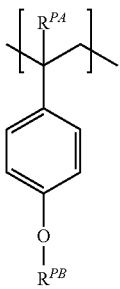
(P3)

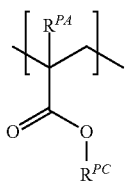
(P4)

wherein,
$R^{PA}$ is a hydrogen atom or an alkyl group,
$R^{PB}$ is an alkyl group or an alkyl ether group, and
$R^{PC}$ is an alkyl group,
and the (A) polymer has a mass average molecular weight of 4,000 to 200,000, the total polymerization ratio of (P3) and (P4) out of all the repeating units in the polymer is 10 to 40 mol %.

2. The composition according to claim 1, which further contains (E) a basic organic compound or (F) a third photoacid generator.

3. The composition according to claim 1, which further contains a combination of (E) a basic organic compound and (G) a weak acid.

4. The composition according to claim 1, wherein, the $R^{XA}$ is an alkylphenyl group.

5. The composition according to claim 1, wherein, the $R^{ZA}$ is a perfluoroalkyl group, and the $R^{ZB}$ is a perfluoroalkyl group or two $R^{ZB}$ is bonded each other by a perfluoroalkylene group.

6. The composition according to claim 1, which further contains a plasticizer.

7. The composition according to claim 1, which further contains a phenolic compound or a hydroxycyclo ring-containing compound that reacts with an acid to increase its solubility in an alkaline aqueous solution and has a mass average molecular weight of 3,000 or less.

8. A method for forming a resist pattern comprising:
a step of coating the chemically amplified positive type photoresist composition according to claim 1 on a substrate to form a coating film,
a step of subjecting the coating film to image-wise exposure, and
a step of developing the exposed coating film with an alkaline aqueous solution.

9. The method according to claim 8, wherein the exposure is performed by deep ultraviolet irradiation.

10. The method according to claim 8, wherein the thickness of the coating film is 0.9 to 15 μm.

11. A method for manufacturing a semiconductor device, comprising the method according to claim 8.

12. The composition according to claim 1, which further contains a surfactant.

13. The composition according to claim 1, wherein;
$R^{PA}$ is hydrogen or an alkyl group having 1 to 3 carbon atoms;
when $R^{PB}$ is an alkyl group, $R^{PB}$ is an alkyl group having 4 to 12 carbon atoms;
$R^{PC}$ is an alkyl group having 4 to 12 carbon atoms;
alkyl portion of $R^{XA}$ has 4 to 12 carbon atoms;
the number of carbon atoms contained in $R^{ZA}$ is 1 to 10; or
the number of carbon atoms contained in $R^{ZB}$ is 1 to 10.

14. The composition according to claim 1, wherein;
$R^{PA}$ is hydrogen or methyl;
when $R^{PB}$ is an alkyl group, $R^{PB}$ is a tertiary alkyl group having 4 to 12 carbon atoms;
$R^{PC}$ is an alkyl group having 4 to 12 carbon atoms and has a tertiary carbon or a quaternary carbon;
(XA) is represented by the formula

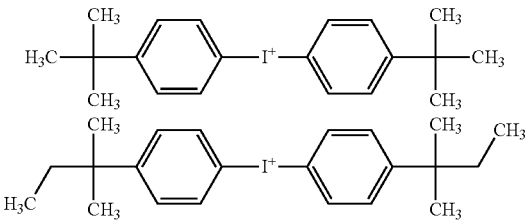

the number of carbon atoms contained in $R^{ZA}$ is 2 to 6; and
the number of carbon atoms contained in $R^{ZB}$ is 2 to 6.

15. The composition according to any one of claim 1, wherein;
the (B) organic solvent is 100 to 900 parts by mass based on 100 parts by mass of the (A) polymer;
the (D) second photoacid generator based on the mass of the (C) first photoacid generator is 0.1 to 11 times;
the formulating amount of the (C) first photoacid generator and the (D) second photoacid generator with respect to the composition is 0.5 to 10 parts by mass;
the (E) basic compound is 0 to 2 parts by mass based on 100 parts by mass of the (A) polymer; or
the surfactant is 2 parts by mass or less based on 100 parts by mass of the (A) polymer.

16. The composition according to any one of claim 1, wherein;
the (B) organic solvent is 100 to 700 parts by mass based on 100 parts by mass of the (A) polymer;
the (D) second photoacid generator based on the mass of the (C) first photoacid generator is 0.3 to 9 times;
the formulating amount of the (C) first photoacid generator and the (D) second photoacid generator with respect to the composition is 1 to 10 parts by mass;
the (E) basic compound is 0.01 to 1 parts by mass based on 100 parts by mass of the (A) polymer; and
the surfactant is 1 parts by mass or less based on 100 parts by mass of the (A) polymer.

* * * * *